United States Patent
Mazotti et al.

(10) Patent No.: US 6,916,121 B2
(45) Date of Patent: Jul. 12, 2005

(54) OPTICAL SUB-ASSEMBLY FOR OPTOELECTRONIC MODULES

(75) Inventors: William Paul Mazotti, San Martin, CA (US); Peter Deane, Los Altos, CA (US); Luu Thanh Nguyen, Sunnyvale, CA (US); Ken Pham, San Jose, CA (US); Bruce Carlton Roberts, San Jose, CA (US); Jia Liu, San Jose, CA (US); Yongseon Koh, Sunnyvale, CA (US); John P. Briant, Cambridge (GB); Roger William Clarke, Cambridge (GB); Michael R. Nelson, Cambridge (GB); Christopher J. Smith, Swaffham Prior (GB); Janet E. Townsend, Fulbourn (GB)

(73) Assignee: National Semiconductor Corporation, Santa Clara, CA (US)

(*) Notice: Subject to any disclaimer, the term of this patent is extended or adjusted under 35 U.S.C. 154(b) by 123 days.

(21) Appl. No.: 10/165,553

(22) Filed: Jun. 6, 2002

(65) Prior Publication Data

US 2003/0026556 A1 Feb. 6, 2003

Related U.S. Application Data

(60) Provisional application No. 60/331,339, filed on Aug. 3, 2001.

(51) Int. Cl.[7] .......................... H01L 23/12; H01L 23/28
(52) U.S. Cl. .............................. 385/88; 385/49; 385/89; 385/90; 385/92
(58) Field of Search ..................... 385/14, 129, 130, 385/88, 89, 90, 92, 49, 52, 42, 24; 257/686, 777; 250/239; 219/121.63

(56) References Cited

U.S. PATENT DOCUMENTS 5,011,246 A 4/1991 Corradetti et al.
5,019,673 A 5/1991 Juskey et al.

(Continued)

FOREIGN PATENT DOCUMENTS

| JP | 60-202956 | 10/1985 |
|----|-----------|---------|
| JP | 08125066  | 5/1996  |

OTHER PUBLICATIONS

S. Savastiouk, Ph.D., et al. "3–D stacked wafer–level packaging", Mar. 2000, *Advanced Packaging*, pp. 28–34.

(Continued)

*Primary Examiner*—John R. Lee
*Assistant Examiner*—David A. Vanore
(74) *Attorney, Agent, or Firm*—Beyer Weaver & Thomas LLP

(57) ABSTRACT

Concepts for conveniently arranging devices for the transduction of signals to and from voltage and current domains to infrared radiation domains is described. Specifically, optoelectronic components and methods of making the same are described. In one aspect, the optoelectronic component includes a base substrate having a pair of angled (or substantially perpendicular) faces with electrical traces extending therebetween. A semiconductor chip assembly is mounted on the first face of the base substrate and a photonic device is mounted on the second face. Both the semiconductor chip assembly and the photonic device are electrically connected to traces on the base substrate. The semiconductor chip assembly is generally arranged to be electrically connected to external devices. The photonic devices are generally arranged to optically communicate with one or more optical fibers. The described structure may be used with a wide variety of photonic devices. In some embodiments the base substrate is formed from a ceramic material having the electrical traces formed thereon. In other implementations the substrate includes a backing block having a flexible printed circuit substrate adhered thereto.

32 Claims, 9 Drawing Sheets

U.S. PATENT DOCUMENTS

| | | | |
|---|---|---|---|
| 5,054,870 A | 10/1991 | Losch et al. |
| 5,139,969 A | 8/1992 | Mori |
| 5,208,879 A | 5/1993 | Gallo et al. |
| 5,325,455 A | 6/1994 | Henson et al. |
| 5,349,317 A | 9/1994 | Notani et al. |
| 5,352,926 A | 10/1994 | Andrews |
| 5,487,124 A | 1/1996 | Bowen et al. |
| 5,515,467 A | 5/1996 | Webb |
| 5,521,992 A | 5/1996 | Chun et al. |
| 5,579,208 A | 11/1996 | Honda et al. |
| 5,590,232 A | 12/1996 | Wentworth et al. |
| 5,608,262 A | 3/1997 | Degani et al. |
| 5,621,837 A | 4/1997 | Yamada et al. |
| 5,723,369 A | 3/1998 | Barber |
| 5,726,079 A | 3/1998 | Johnson |
| 5,744,827 A | 4/1998 | Jeong et al. |
| 5,774,616 A | 6/1998 | Matsuda |
| 5,780,875 A | 7/1998 | Tsuji et al. |
| 5,790,384 A | 8/1998 | Ahmad et al. |
| 5,798,567 A | 8/1998 | Kelly et al. |
| 5,821,615 A | 10/1998 | Lee |
| 5,864,642 A | 1/1999 | Chun et al. |
| 5,896,479 A | 4/1999 | Vladic |
| 5,933,558 A | 8/1999 | Sauvageau et al. |
| 5,949,135 A | 9/1999 | Washida et al. |
| 6,027,254 A | 2/2000 | Yamada et al. |
| 6,043,430 A | 3/2000 | Chun |
| 6,054,759 A | 4/2000 | Nakamura |
| 6,075,284 A | 6/2000 | Choi et al. |
| 6,086,263 A | 7/2000 | Selli et al. |
| 6,201,704 B1 | 3/2001 | Poplawski et al. |
| 6,236,109 B1 | 5/2001 | Hsuan et al. |
| 6,239,427 B1 | 5/2001 | Mizue |
| 6,258,630 B1 | 7/2001 | Kawahara |
| 6,281,568 B1 | 8/2001 | Glenn et al. |
| 6,305,848 B1 | 10/2001 | Gregory |
| 6,316,837 B1 | 11/2001 | Song |
| 6,316,838 B1 | 11/2001 | Ozawa et al. |
| 6,318,902 B1 | 11/2001 | Igl et al. |
| 6,318,909 B1 | 11/2001 | Giboney et al. |
| 6,356,686 B1 | 3/2002 | Kuczynski |
| 6,364,542 B1 | 4/2002 | Deane et al. |
| 6,450,704 B1 | 9/2002 | O'Connor et al. |
| 6,635,866 B2 | 10/2003 | Chan et al. |
| 2001/0013645 A1 | 8/2001 | King et al. |
| 2001/0048151 A1 | 12/2001 | Chun |

OTHER PUBLICATIONS

National Semiconductor, "Packaging Databook", *1993 National Semiconductor*, pp. v–xi to 1–3 to 1–4, 3–1 to 3–20, 3–30 to 3–31, 3–62 to 3–69. *Please note: The year of publication is sufficiently earlier than the effective U.S. filing date so that the particular month of publication is not in issue.*

OPTICAL SUB-ASSEMBLY FOR OPTOELECTRONIC MODULES

CROSS-REFERENCE TO RELATED APPLICATIONS

This application claims priority of U.S. provisional patent application No. 60/331,339, filed Aug. 3, 2001, entitled "OPTICAL SUB-ASSEMBLY FOR OPTO-ELECTRONIC MODULES," which is hereby incorporated by reference.

This application is related to U.S. patent application Ser. No. 09/568,094, entitled "DEVICE AND METHOD FOR PROVIDING A TRUE SEMICONDUCTOR DIE TO EXTERNAL FIBER OPTIC CABLE CONNECTION," filed on May 9, 2000, to U.S. patent application Ser. No. 09/568,558, entitled "ARRAYABLE, SCALABLE AND STACKABLE MOLDED PACKAGE CONFIGURATION," filed on May 9, 2000, to U.S. patent application Ser. No. 09/713,367, entitled "MINIATURE OPTO-ELECTRIC TRANSCEIVER," filed on Nov. 14, 2000, to U.S. patent application Ser. No. 09/922,358 entitled "MINIATURE SEMICONDUCTOR PACKAGE FOR OPTO-ELECTRONIC DEVICES," filed on Aug. 3, 2001, and to U.S. patent application Ser. No. 09/947,210 entitled "TECHNIQUES FOR JOINING AN OPTO-ELECTRONIC MODULE TO A SEMICONDUCTOR PACKAGE," filed on Aug. 3, 2001, to U.S. patent application Ser. No. 10/165,711 entitled "CERAMIC OPTICAL SUB-ASSEMBLY FOR OPTO-ELECTRONIC MODULES," filed concurrently herewith, and to U.S. patent application Ser. No. 10/165,548 entitled "TECHNIQUES FOR ATTACHING ROTATED PHOTONIC DEVICES TO AN OPTICAL SUB-ASSEMBLY IN AN OPTOELECTRONIC PACKAGE," filed concurrently herewith, the content of each of which are hereby incorporated by reference.

FIELD OF THE INVENTION

The present invention relates generally to transduction modules, and more specifically, to opto-electronic modules.

BACKGROUND OF THE INVENTION

Most computer and communication networks today rely on copper wiring to transmit data between nodes in the network. Since the data transmitted over the copper wire and the data processed within the nodes are both represented in the form of electrical signals, the transfer of data at the node-copper wire interface is straight forward. Other than perhaps a level shift and signal amplification, no other signal processing is required for data transmitted over the copper wire to be decoded by the node. The drawback with using copper wire is its relatively low bandwidth. Copper's ability to transmit data is significantly limited compared to other media, such as fiber optics. Accordingly much of the computer and communication networks being built today, including the Internet, are using fiber optic cabling instead of copper wire.

With fiber optic cabling, data is transmitted using light signals, not electrical signals. For example, a logical one may be represented by a light pulse of a specific duration and a logical zero may be represented by the absence of a light pulse for the same duration. In addition, it is also possible to transmit at the same time multiple colors of light over a single strand of optic fiber, with each color of light representing a distinct data stream. Since light is attenuated less in fiber than electrons traveling through copper, and multiple data streams can be transmitted at one time, the bandwidth of optic fiber is significantly greater than copper.

While fiber optic cabling is very efficient for transferring data, the use of light signals to process data is still very difficult. Data is typically transferred and stored in various locations before, during and after it is operated on in a computer. There still is no efficient way to "store" light signals representative of data. Networks will therefore likely continue using fiber optics for transmitting data between nodes and silicon chips to process the data within the nodes for the foreseeable future. The interface between the fiber optic cable and the nodes that process the data is therefore problematic because signals need to be converted between the electrical and the light domains.

Fiber optic transceivers, which convert light signals from a fiber optic cable into electrical signals, and vice versa, are used as the interface between a fiber optic line and a computer node. A typical transceiver includes a substrate, grooves etched in the substrate to receive the individual fiber optic strands, one or more semiconductor devices mounted on the substrate, one or more discrete optical detectors for converting light signals received over the fiber optic cables into electrical signals, one or more discrete optical emitters for converting electrical signals from the semiconductor devices into light signals. A number of fiber optic transceivers are commercially available from Hewlett Packard, AMP, Sumitomo, Nortel, and Siemens. The problem with all of these fiber optic transceivers is that they are expensive and difficult to fabricate. With each transceiver, the semiconductor devices, emitters, and optical detectors have to be individually mounted onto the substrate, which is a costly and time-consuming process. This limits the applications in which optical interconnects could be substituted for traditional copper usage. Furthermore, the use of discrete emitters and optical detectors adversely affects the performance of the transceiver because electrical parasitics between discrete components are sources of electrical attenuation of inter-chip signals at Gigabit per second speeds that are generally used with such transceivers. To compensate for the electrical parasitics, more power is required to drive these traces than would be needed for an integrated device. The form factor of the on-board optical transceiver is relatively large and therefore does not facilitate inter-board and chip-to-chip optical interconnectability. Also, current opto-electronic packages have relatively large form factors. For instance, some opto-electronic packages and their attachment configurations require optical fibers to bend in order to be connected to the active facets of the optical device. Unfortunately, optical fibers can only bend with relatively large radii, thereby causing the opto-electronic packages to occupy large amounts of space.

A low cost semiconductor device that has a small form factor and that provides a true die to external fiber optic connection is therefore needed.

BRIEF SUMMARY OF THE INVENTION

To achieve the foregoing and other objects and in accordance with the purpose of the present invention, an opto-electronic component is described that includes a base substrate having a pair of faces that are angled relative to one another with electrical traces extending from the first face to the second face. A semiconductor chip assembly is mounted on the first face of the base substrate and a photonic device is mounted on the second face. Both the semiconductor chip assembly and the photonic device are electrically connected to the traces on the base substrate. The semiconductor chip assembly is generally electrically connected to an external device. The photonic device(s) is generally arranged to optically communicate with one or more optical fibers. The described structure may be used with a wide variety of photonic devices. It is particularly well adapted for use with vertical cavity surface emitting lasers (or laser arrays) and detectors (or detector arrays).

In some embodiments, the first and second faces of the base substrate are substantially perpendicular to one another. In other embodiments, they are angled at slightly less than 90 degrees to help reduce back reflectance interference between the active facet(s) of the photonic device and the optical fiber(s). The angling of the optical fiber tip relative to the photonic device can be achieved in a number of other ways as well, but is not required.

In some embodiments the base substrate is formed from a ceramic material having the electrical traces formed thereon. In other implementations the base substrate includes a backing block with a flexible printed circuit interface adhered thereto. In the implementation that includes a flexible circuit, the corner between the first and second faces is preferably smoothly rounded.

In some embodiments, the cathode of the photonic device is soldered directly to a cathode pad on the base substrate. In various embodiments, the anodes are directly soldered or wire bonded (as for example reverse wire bonded) to associated traces on the base substrate. Similarly, in some embodiments, the semiconductor chip assembly (which may be a bare or packaged die) is electrically connected to the base substrate by direct soldering contacts on the assembly to the substrate.

The base substrate may include a pair of alignment pins that extend from the second face to engage a fiber termination (ferrule) that holds the optical fiber(s) in order to help precisely align the optical fiber(s) relative to the photonic device.

One advantage of the described packages is that electrical path lengths of less than approximately 2 mm can be readily and economically achieved.

In another aspect, a particular support block configuration for use in an opto-electronic package is described. In this aspect, the support block includes a first wall having a first face suitable for supporting a semiconductor device. The support block also includes a second wall having a second face that is angled relative to the first face, with a smoothly rounded corner being formed between the faces. Preferably, the radius of the rounded corner joining the first and second faces is between approximately 25 and 500 microns. A pair of sidewalls that extend between the first and second walls may also be provided. The second wall may also include a pair of alignment holes that receive alignment pins suitable for engaging an optical fiber termination. An alignment slot is also provided in the second wall to align the block relative to a sleeve, which holds the packaged opto-electronic component. Preferably, the second and sidewalls each have a thickness that is within 20 percent of the thickness of the first wall.

In another aspect, a method of forming a component for use in an opto-electronic package is described. In this aspect a flexible substrate is adhered to a backing block having a pair of angled or substantially perpendicular walls. A photonic device is attached to the flexible substrate at a location over the first wall. A driver device is attached to the flexible substrate at a location over the second wall.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to an optical sub-assembly (OSA), which is an interface device for translating high-speed electrical data signals into optical data signals (and vice versa). The optical sub-assembly has a supporting wall with photonic devices that are mounted in a normal orientation with respect to the supporting wall. The optical sub-assembly is designed to couple tightly to the semiconductor chip sub-assembly (CSA) so that the electrical path lengths between the photonic devices and the semiconductor chip are minimized. In this manner, electrical interference from parasitic inductance and capacitance is minimized, signal integrity is maximized, and power requirements are reduced. The optical sub-assembly can be used to form transduction modules such as optical-electrical modules for transceiver, transmitter and receiver applications. Such applications include, but are not limited to, chip-to-chip, board-to-board, chassis-to-chassis, and system-to-system inter-networking. More generally stated, the concepts of the present invention can be used to conveniently arrange devices for the transduction of signals to and from voltage and current domains to infrared radiation domains.

It is noted that any reference to specific brands of products with respect to making or using the present invention is only for exemplary purposes. Alternative products having the same properties can be acceptably used in place of the specifically mentioned brands.

Figure 1:
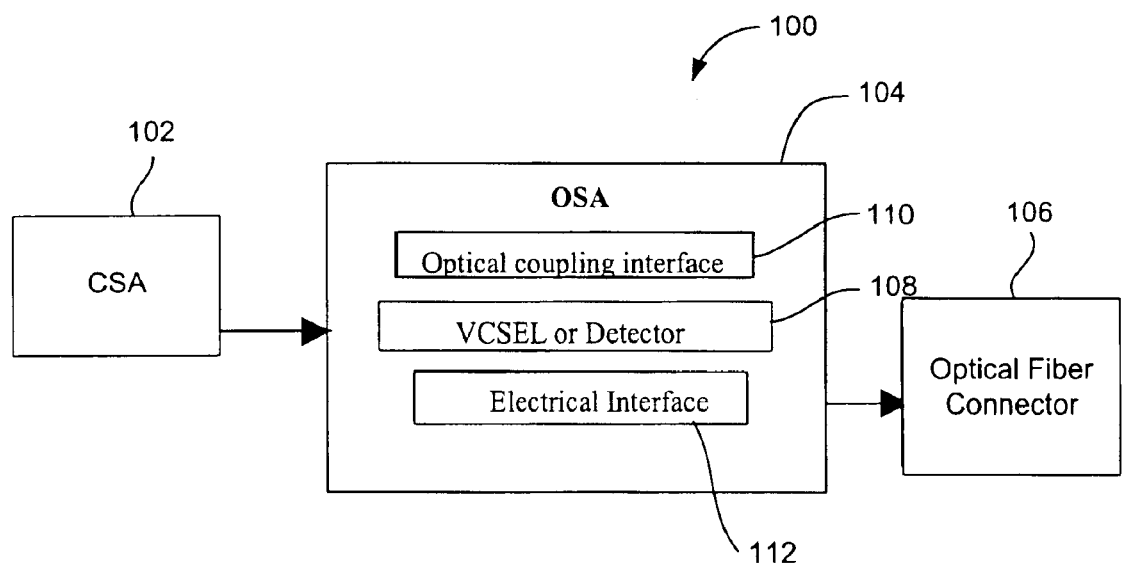
FIG. 1 is a block diagram describing the structural overview of the opto-electronic module of the present invention.

FIG. 1 is a block diagram describing the structural overview of the opto-electronic module of the present invention. The opto-electronic module 100 is composed of a semiconductor chip sub-assembly (CSA) 102 that is attached to an optical sub-assembly (OSA) 104. The CSA 102 and the OSA 104 operate together to translate optical signals to electrical signals and vice-versa. The OSA 104 receives and transmits optical signals from and to optical fibers that are connected to the OSA 104. Optical fiber connector 106 represents a connector that attaches a ribbon of multiple optical fibers to the OSA 104. The CSA 102 can be formed of a variety of semiconductor chip packages that have electrical connection pathways for connection to optical sub-assemblies. For instance, the CSA 102 can be a leadless leadframe package (LLP) that has up-linking contact surfaces that are exposed through the top surface of the LLP. CSA 102 can also be any type of driver device, such as multi-chip assemblies, as well as conventional driver boards. The OSA 104 is essentially made up of photonic devices 108, an optical coupling interface 110, and an electrical interface 112. The photonic devices 108 are either optical emitters (e.g., lasers) or detectors. The photonic devices 108 can include a single laser or detector or the devices can include a multiple array of either emitters or detectors. In a preferred embodiment of the present invention, the photonic devices 108 are vertical cavity surface emitting lasers (VCSELs). VCSELs are a type of emitter that requires lower amount of power and has a high degree of operational reliability. Various transduction devices can be used in place of the photonic devices. For instance, other types of suitable transduction devices can contain components such as, but not limited to, windows, lenses, prisms, and gratings. For more details regarding CSA's that are formed from LLP's, refer to U.S. patent application Ser. No. 09/922,358, entitled "MINIATURE SEMICONDUCTOR PACKAGE FOR OPTO-ELECTRONIC DEVICES".

The optical coupling interface 110 is the structural interface where the photonic devices 108 connect to the optical fiber connector. The electrical interface 112 is the structural interface that allows the photonic devices 108 to be electrically connected to the CSA 102.

Figure 2:
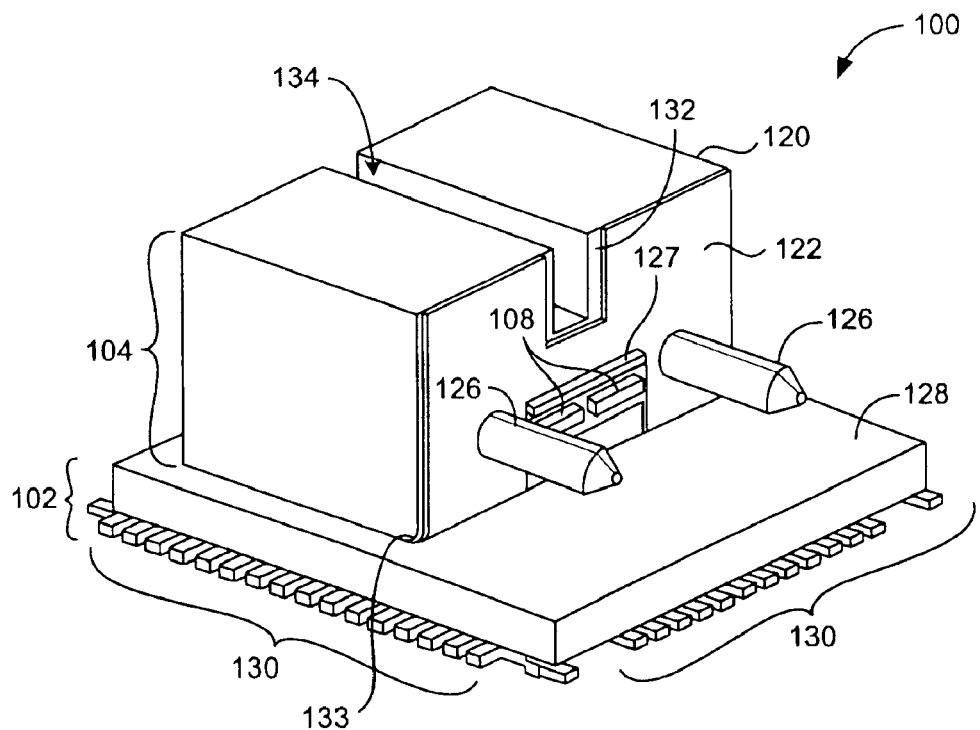
FIG. 2 illustrates a perspective view of an opto-electronic module that is made up of a CSA and an OSA according to one embodiment of the present invention.

FIG. 2 illustrates a perspective view of an opto-electronic module 100 that is made up of a CSA 102 and an OSA 104 according to one embodiment of the present invention. The OSA 104 is formed of a backing block 120, a flexible circuitry tape 122, photonic devices 108, and alignment pins 126. The CSA 102 is shown to be an LLP that has a molded plastic package 128 with contact leads 130 that protrude from the bottom surface.

Figure 3:
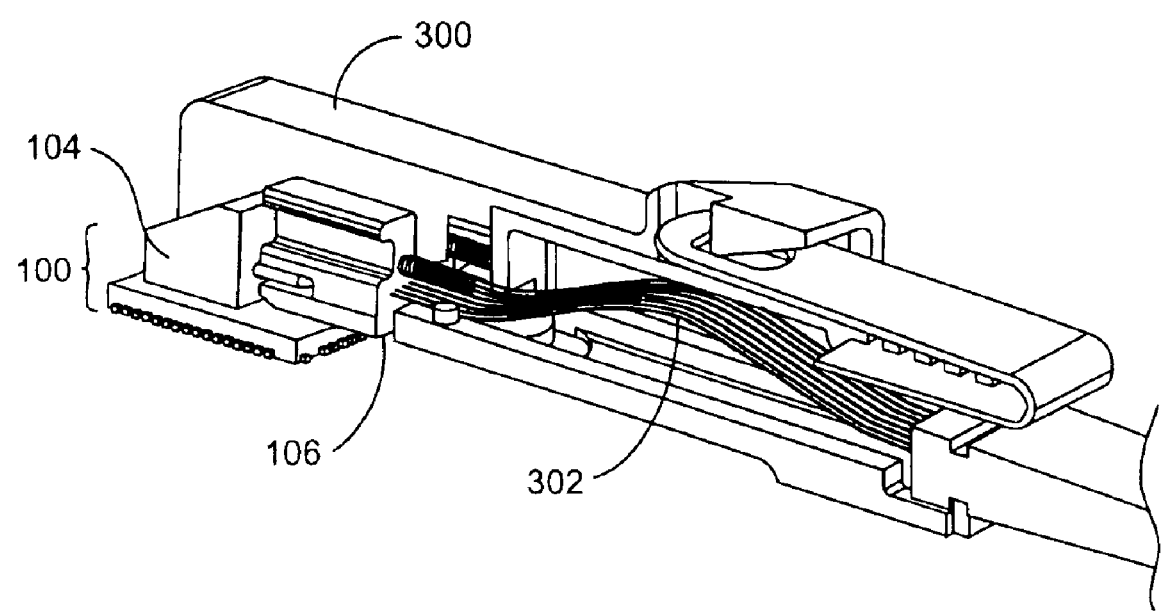
FIG. 3 illustrates a cut-away, perspective view of the opto-electronic module and optical fiber connector inserted into a protective sleeve device.
Figure 5A:
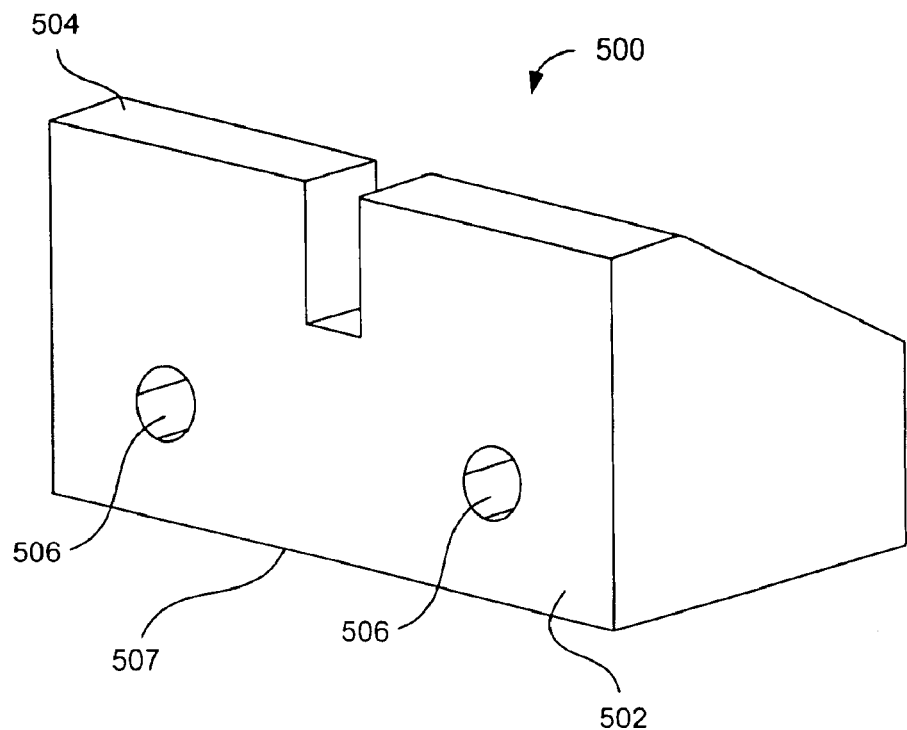
FIG. 5A illustrates a front, perspective view of an isolated backing block according to one embodiment of the present invention.
Figure 5B:
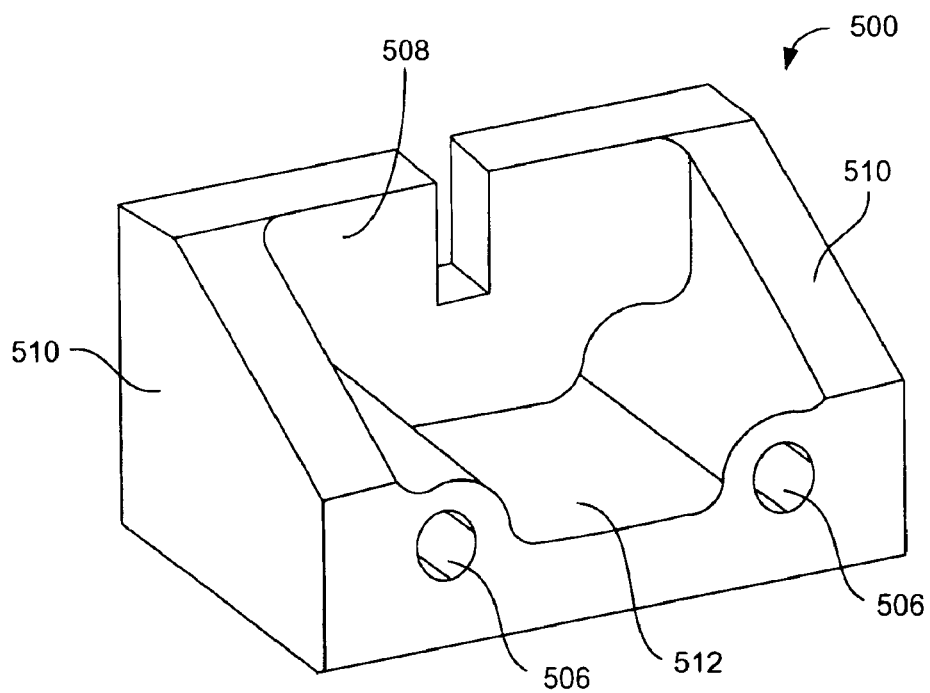
FIG. 5B illustrates a rear, perspective view of the backing block in FIG. 5A.

The backing block 120 is the main structural component that forms the OSA 104. Backing block 120 is a block with a front surface 132 for supporting the flexible circuitry tape 122, the photonic devices 108 that are attached to the flexible circuitry tape 122, and the alignment pins 126. Backing block 120 need not have a strictly block shape as shown in FIG. 2. In some embodiments, it is preferable to have a somewhat triangular shape as is shown in FIGS. 3, 5A and 5B, for manufacturing reasons that will be explained later. A slot 134 is formed in the top surface of the backing block 120. One of the purposes of slot 134 is to facilitate attachment of a protective case or sleeve over opto-electronic module 100. The case or sleeve protects opto-electronic module 100 during handling and operation. For more detail regarding the case or sleeve, refer to U.S. patent application Ser. No. 09/713,367, entitled "MINIATURE OPTO-ELECTRIC TRANSCEIVER".

The backing block 120 can be formed of a variety of materials, however, it is preferable to form the backing block 120 from polyethylene ether ketone (PEEK) or liquid crystal polymer (LCP). It is also possible that the backing block 120 can be formed of polyphenylene sulfide (PPS) or ceramic (e.g., $Al_2O_3$). The pins 126 can be made of steel or stainless steel.

The flexible circuitry tape 122 forms the electrical interface, which connects the photonic devices 108 to the CSA 102. The flexible circuitry tape 122, referred to as "flexi," is a flexible tape material having embedded electronic circuit traces. The flexi 122 covers the front surface 132 of the backing block 120, wraps around the bottom-front corner 133 of the backing block 120, and covers most of the bottom surface of the backing block 120. The traces within the flexi 122 run from the photonic devices 108 on the front surface to the bottom surface of the backing block 120 where they make contact with up-linking, electrical contacts on the CSA 102. The bottom-front corner 133 has a rounded edge for at least several reasons. First, the flexi 122 is attached to the backing block 120 with adhesive material that can bulge at the edges of a sharply formed bottom-front corner. Bulging can cause poor adhesion of the flexi to the backing block. Such bulging of the adhesive material can be substantially reduced by attaching the flexi to a backing block that has a rounded corner, rather than a sharp corner. Secondly, a rounded corner can reduce the length of circuitry traces of the flexi 122 required to connect photonic devices 108 to electrical contact surfaces on the top surface of the CSA 102. It is noted that, the ability to shorten the length of the circuitry depends upon how far past the rounded corner a trace extends on each of the bottom and front surfaces of the backing block. Trace lengths can be shortened by terminating the traces at a distance close to the rounded corner. The traces should terminate beyond the curved portion of the rounded corner so that a contact pad of the trace can be formed on a substantially flat surface. Reducing the length of the circuitry traces improves the electrical performance of the opto-electronic module 100 because electrical interference due to inductance and capacitance is reduced. The radius of the rounded corner can also lessen the likelihood that the circuitry traces on flexi 122 will crack when bent around the corner of the backing block.

The flexi 122 has holes formed within so that the alignment pins 126 can pass through the flexi 122 and into the backing block 120. The flexi 122 will be described in much more detail in the following figures.

The alignment pins 126 are length-wise pins that are inserted into the backing block 120. The pins 126 serve to align the connection between the photonic devices 108 of the OSA 104 and optical fibers to be connected to the OSA 104. Tolerances for the alignment between the OSA 104 and an optical fiber connector are very high, therefore, the positioning of the holes into which the alignment pins are inserted and the alignment pins themselves should be manufactured with precision. Alignment pins 126 can extend from backing block 120 at a variety of predetermined angles, not necessarily perpendicular to the front surface of backing block 120, to serve the alignment function. Pins 126 can take on various shapes and forms in alternative embodiments. For instance, pins 126 can be integrally formed from the ceramic material of backing block 120.

Two photonic devices 108 are shown to be connected to the flexi 122. In this embodiment, the photonic devices 108 contains an array of VCSELs and the other contains an array of optical detectors. The combination of laser emitters and detectors on OSA 104 makes the opto-electronic module 100 a transceiver. For instance a 4-channel transceiver may be formed of one 1×4 laser emitter array and one 1×4 detector array. However, in alternative embodiments, only one array of laser emitters may be connected to the OSA 104, thereby making the module 100 a transmitter. For instance, a twelve-channel transmitter can have a single 1×12 VCSEL array module with 12 fiber connections. Likewise, in another alternative embodiment, only one array of detectors is connected to the OSA 104, thereby making the module 100 a receiver. For instance, a twelve-channel detector can have a single 1×12 detector array module with 12 fiber connections.

Shim 127 is attached to flexi 122 at a position that is above photonic devices 108 and between alignment pins 126. Shim 127 acts as a spacer to prevent a ferrule, such as ferrule 106 in FIGS. 3 and 4, from making contact with photonics 108 when attached to backing block 120. Shim 127 also maintains a fixed separation distance between photonic devices 108 and the optical fibers that are to be attached to module 100. Shim 411 operates by acting as a barrier against which the ferrule comes into contact with when attached to OSA 400. To be effective, shim 127, is formed to have a height that extends past the height of photonic devices 108. Shim 127 can be formed out of a variety of materials that can be manufactured with a high degree of precision. For example, shim 127 can be formed of stainless steel. Shim 127 can be attached to flexi 122 using various types of adhesives. Shim 127 is shown to be a long block of material, however, it can also be replaced with multiple shims that are smaller in size.

FIG. 3 illustrates a cut-away, perspective view of the opto-electronic module 100 and optical fiber connector ferrule 106 inserted into a protective sleeve device 300. Half of the protective sleeve device 300 has been cut away in order to show the module 100. As mentioned above, the sleeve device 300 protects the module 100 during physical handling and during operation (e.g., when the module 100 has been connected to an electrical device). Optical fiber connector ferrule 106 is shown to be attached to the OSA 104. The optical fiber connector ferrule 106 clamps a ribbon of optical fibers 302 so that at least some of the fibers within the ribbon are optically connected to an active facet of each of the photonic devices 108. In some embodiments, some of the optical fibers do not connect to a photonic device. This occurs, for example, when a continuous ribbon of fibers is connected to two photonic devices that are separated apart from each other. In this case, while the fibers on the outer edges of the ribbon connect to photonic devices, the fibers in the middle of the ribbon are held in front of the space between the photonic devices, and are therefore inactive. The optical fiber connector ferrule 106 is inserted over the alignment pins 126 so that proper alignment is ensured.

Figure 4:
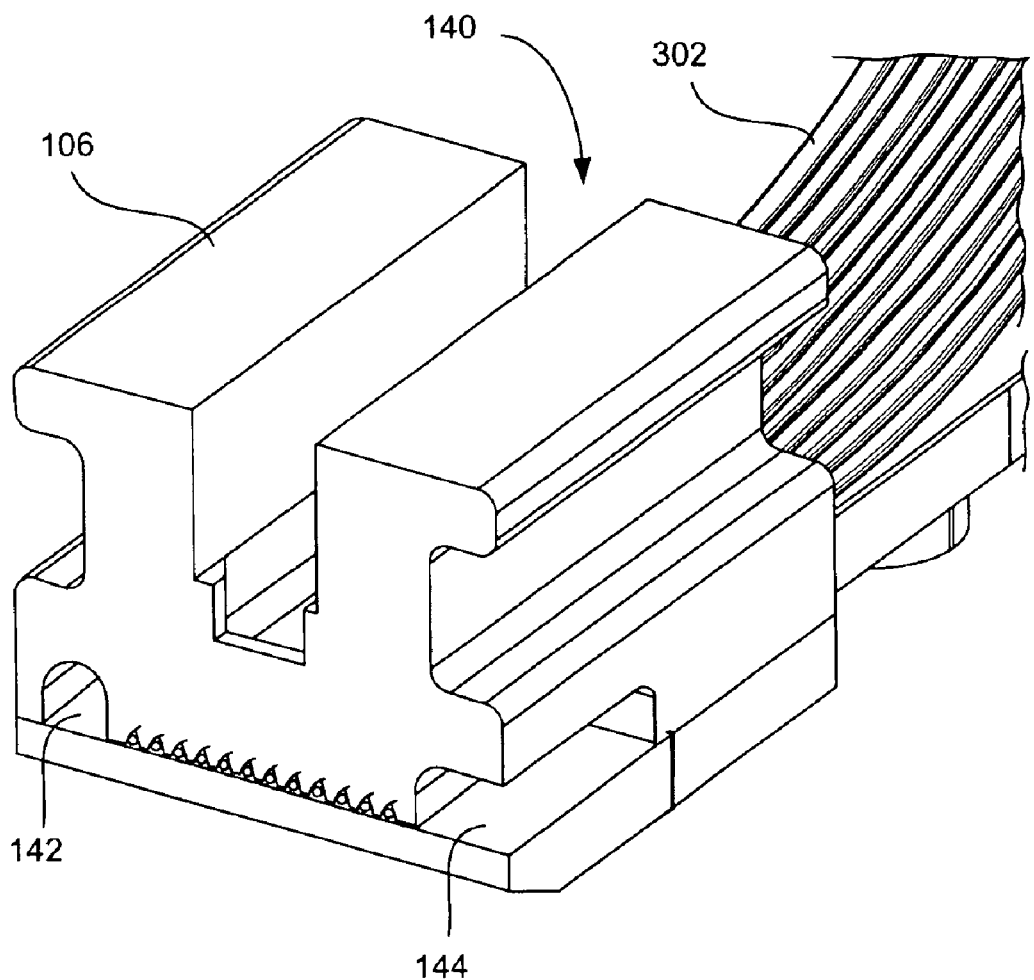
FIG. 4 illustrates an isolated perspective view of the optical fiber connector ferrule, which clamps onto a ribbon of optical fibers.

FIG. 4 illustrates an isolated perspective view of the optical fiber connector ferrule 106, which clamps onto a ribbon of optical fibers 302. Optical fiber connector ferrule 106 has formed within it, a slot 140 that receives a protruding portion of the sleeve device 300 and two alignment holes 142 and 144. Alignment holes 142 and 144 receive the alignment pins 126. To maintain the high tolerances required for the connection between each of the optical fibers and the photonic devices 108, optical fiber connector 106 should be manufactured with precision. Specifically, the size and location of the alignment holes 142 and 144 should be carefully formed. Alignment hole 142 is an enclosed hole within which an alignment pin 126 is secured. Alignment hole 144, however, has an open side in order to facilitate the insertion of the two pins. Dynamic constraint is established with such a design since the open side allows for minor misalignment due to thermal mismatch or manufacturing tolerances of the various components. A design that calls for pin insertion into two circular holes requires much tighter tolerances than can be achieved in a cost-effective manner with the current materials selected.

FIG. 5A illustrates a front, perspective view of an isolated backing block 500 according to one embodiment of the present invention. FIG. 5B illustrates a rear, perspective view of the backing block 500 in FIG. 5A. The backing block 500 provides the structural support for the OSA and therefore is the foundation of the OSA. As can be seen in FIG. 5A, the backing block 500 has a front surface 502, a top surface 504, and a bottom surface (out of view) that is opposite the top surface. The front surface 502 is substantially a flat surface intended to support one or more photonic device arrays. The entire front surface need not be substantially flat, however, it is preferable because it simplifies the manufacturing of the backing block 500. The front surface 502 contains two alignment holes 506 that are sized to receive and secure alignment pins. The top-rear portion of the backing block 500 is truncated. The rear portion of the backing block 500 will be described in further detail with respect to FIG. 5B. Alignment holes 506 can serve as alignment targets for positioning the flexi onto the backing block and the photonic devices onto the flexi. Therefore, alignment holes 506 should be made with precision. As will be explained later, the holes in the flexi that allow for alignment pins to pass through the flexi can also be used by manufacturing systems for alignment targeting purposes.

A slot 508 is created in the front and top surfaces 502 and 504 that is designed to receive a protruding portion of a sleeve device. The connection between the slot 508 and the protruding portion of the sleeve device tends to secure the connection between the two components, and provide coarse alignment of the sleeve/connector/ferrule structure with respect to the OSA block. As was shown in FIG. 2, electronic circuit traces will be attached to both the front surface 502 and the bottom surface of the backing block in order to connect photonic devices to the semiconductor chip of a CSA. The electronic traces are added either by attaching a flexible circuitry tape or by embedding or depositing the traces into the body of the backing block.

In this embodiment of the backing block 500, the bottom-front corner 507 of the backing block 500 has a sharp edge. It is noted that a rounded front-bottom corner is preferable for the reasons presented above. However, for backing pieces made from ceramic the rounded front-bottom corner is not necessary.

In FIG. 5A, the front surface 502 is perpendicular to the bottom surface of the backing block 500. The relative angles of these two surfaces will determine the angle at which optical fibers should be attached to the backing block 500 in order to have a fully functional opto-electronic module. The upright orientation of the front surface 502 is advantageous for attaching VCSELs to the backing block since optical fibers can then be attached to the front surface 502 in approximately a perpendicular orientation with the front surface of the backing block. In this way, optical fibers need not be bent in order to make a connection with the opto-electronic device made with the backing block 500. As is commonly known, bending of optical fibers creates inefficiencies in the transmission of light through the fibers. In alternative embodiments, the origination of the front surface 502 to the bottom surface of the backing block may be offset from perpendicular. This may be advantageous depending upon the physical constraints into which the opto-electronic module will be used.

FIG. 5B illustrates a rear view of the backing block 500 and shows that the backing block 500 is generally formed of four panels—a front panel 508, two side panels 510, and a bottom panel 512. For manufacturing purposes, the four panels have approximately the same thickness. This is advantageous when the backing block 500 is formed by a molding process (e.g., injection molding) at high temperatures because the various regions of the backing block can cool at the same rate during the cooling stages of the manufacturing process. By cooling at the same rate, it is more likely to obtain backing blocks manufactured with the required dimensional tolerances. The thickness of the four panels is also advantageous during the operation of the formed opto-electronic module for heat transfer characteristics. For example, a thinner backing block would allow heat to transfer more quickly away from the opto-electronic module and into the sleeve device, which is more capable of dissipating heat. In general the configuration of the backing block should be designed to make contact with the sleeve device as shown in FIG. 3 to increase mechanical stability and thermal dissipation. In an alternative embodiment, backing block 500 can have an additional panel that is positioned in between and parallel to side panels 510. Such an additional panel can provide extra support to front and bottom panels 508 and 512.

For manufacturing purposes, it is preferable to leave a flat area on the top surface of the bottom panel 512 so that vacuum-based pick-and-place machines can pick up the backing block 500. Preferably, the backing block has a flat area having a minimum 250 um diameter to ensure pick and place compatibility. Of course, the backing block 500 can be handled by alternative pick-and-place machines that do not require flat surfaces to be effective.

There are various material and design choices to be made before manufacturing the backing block. Some of these choices will now be presented. First, the material used to manufacture the backing block should survive typical reflow temperatures as high as 260° C. for 60 seconds. Also, the molding process should be highly precise so that the alignment holes are precisely placed in the backing block. Achieving 10 um parallelism and perpendicularity generally ensures that alignment can be maintained between the pins and the ferrule/connector structure. In some cases, optical coupling performance starts to degrade when misalignment exceeds the 10 um limit. Also, the bottom surface of the backing block preferably has a structure that creates a reproducible standoff height between the OSA and a CSA. This can be achieved for example by forming legs of a known height on the bottom surface of the backing block, or by precisely controlling the positioning of the OSA on the CSA during the solder reflow attach process.

Figure 6:
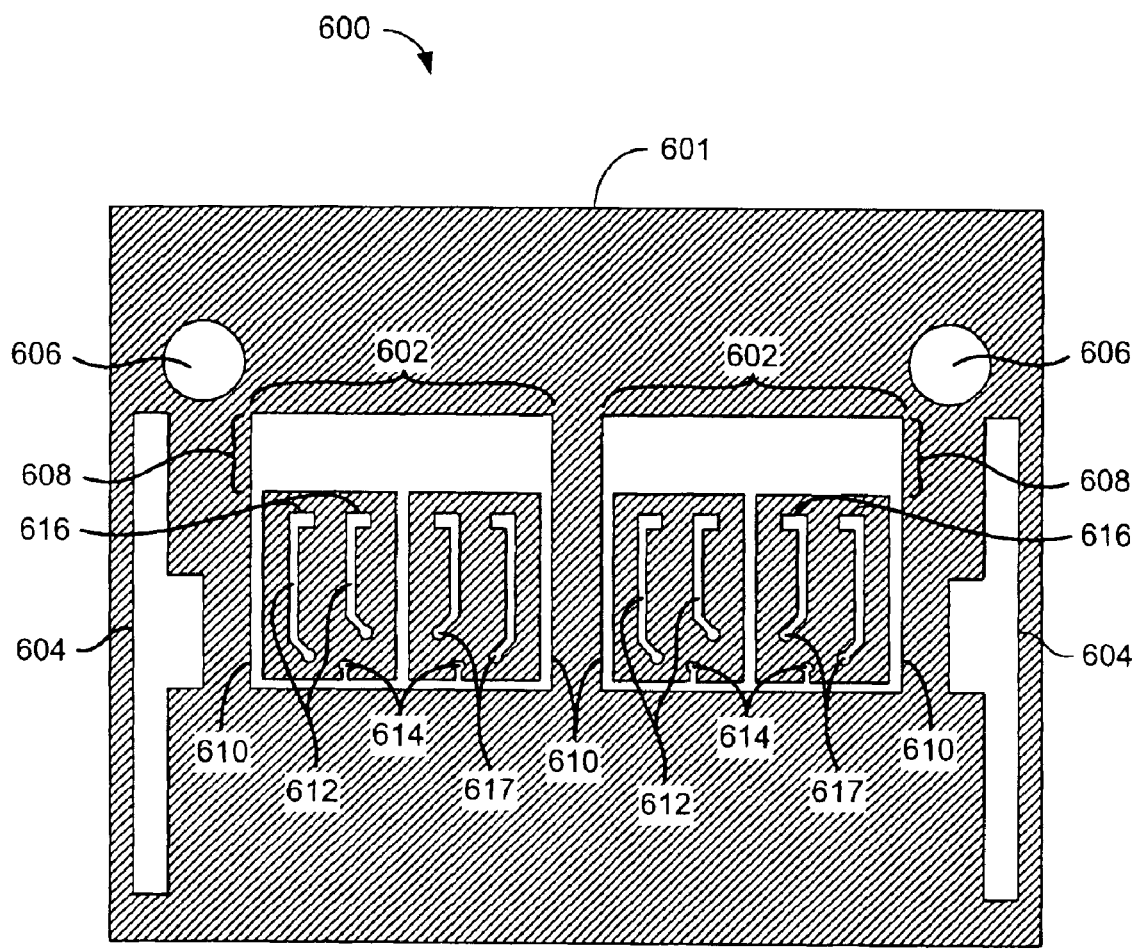
FIG. 6 illustrates a plan view of the top surface of a flexible circuitry tape according to one embodiment of the present invention.

The flexible circuitry tape will now be described in further detail. FIG. 6 illustrates a plan view of the front or active surface of a flexible circuitry tape 600 according to one embodiment of the present invention. The flexi is designed to cover the front and underside faces of the OSA. The underside of the backing block is placed in contact with the CSA up-linking contact surfaces, while the front side mounts photonic arrays. The flexi is designed to meet high-speed data applications. Flexible circuitry tape 600, or flexi, is made of a flexible tape material 601, which supports electric circuitry sets 602. Electric circuitry sets 602 can be either embedded within or formed on the surface flexible tape material 601. The flexible tape material can be a flexible material such as polyimide, which can be Kapton by DuPont. The front or active surface of flexi tape 600 also supports metal stiffening pieces 604. The metal circuitry sets 602 and the stiffening pieces 604 are typically copper based. In alternative embodiments, various other conductive materials can be used to form circuitry sets 602. For example, conductive polymers or graphite could also be used. Alignment holes, or fiducials, 606 are created in the flexi 600 so that after the flexi 600 is attached to the backing block, alignment pins can be inserted into the backing block through the flexi 600. The size of the alignment holes 606 should be sized to be just slightly larger than the alignment pins so that the holes 606 do not fit either too tightly or too loosely over the pins. In the manufacturing process, the alignment holes 606 can serve as alignment targets for positioning the flexi 600 onto the backing block. Therefore, the flexi and the holes in the flexi should be made with high dimensional tolerances.

Circuit sets 602 each contain an attachment pad 608, cathode traces 610, and anode traces. The attachment pad 608 serves as the connection pad that will make contact with the cathode of the photonic devices to be mounted. Cathode traces 610 are connected to the attachment pad 608 such that the attachment pad 608 can be ultimately connected to electrical contacts of the CSA. FIG. 6 shows contact pads 614 formed on the cathode traces 610. Bond pads 614 provide a specific area for the cathode traces 610 to make contact with a CSA. In alternative embodiments of the present invention, specific bond pads need not be formed on the cathode traces in order to make contact with a CSA. For instance, contact could be made with the cathode trace anywhere along the length of the traces. Anode traces 612 provide the electrical pathway from the anodes of the photonic devices to a CSA. Anode traces 612 have bond pads 616 formed at the ends of the traces near the attachment pad 608. Bond pads 616 provide a surface for wire bonding a wire to the anode traces 612 wherein the other end of the wire will connect to the anode of a respective photonic device. Anode traces 612 also have bond pads 617 formed on the traces on the opposite end from the bond pads 616. The bond pads 617 provide a contact area to connect the anode traces 612 to the contacts of a CSA. The surfaces of the copper to be wirebonded and soldered are preferably gold flashed. Each circuitry set 602 preferably has a number of anode traces equal to the number of photonic devices attached to the attachment pad so that the anode of each photonic device can be connected to an anode trace. Therefore, the flexi can be made for different channel counts for transmitters, receivers, and transceivers by adding or removing trace connections. Once again, the length of the cathode and anode traces, 610 and 612, should be minimized to reduce electrical cross-talk. In alternative embodiments of the present invention, copper planes can be added into the flexi for additional electrical grounding. Circuitry set 602 can be formed through various methods including metal deposition processes and pre-forming the traces and pads.

Metal stiffening pieces 604 are thin pieces of metal attached to the surface of the flexible tape material 601. The stiffening pieces add stiffness to the flexi 600, which helps the flexi maintain its form when it is bent around the front-bottom corner of a backing block. The stiffening pieces can have a variety of shapes and be placed in different areas of the tape. In an alternative embodiment, the flexi can be made stiffer by placing an array of small metal pieces on the flexible tape material 601. For example, an array of small metal pieces can form a tessellated pattern on the flexi. In some embodiments of the flexi, the stiffening pieces are attached to the back surface of the flexi. In other embodiments, stiffening pieces are not located on the portion of the flexible tape that bends around the corner of the backing block. The stiffening pieces can be made of an appropriately stiff material or a metal such as copper.

Soldering will be performed on the flexi in order to connect optical and electrical components to the flexi. Soldering specifically will be placed on the bond pads 617 of anode traces 612 and the cathode bond pads 614. The photonic device arrays can be attached to the attachment pad 608 by using solder or a conductive epoxy. In order to prevent the solder from spreading across the surface of the flexi and thereby possibly causing short circuits, a solder mask is preferably placed over the entire top surface of the flexi. Holes in the solder mask are created to expose the bond pads 614 and 616, the ends of the anode traces 612 opposite the bond pads 612, and the attachment pad 608. As is commonly known, the solder mask also prevents the copper metal of the circuitry sets 602 from oxidizing.

Figure 7:
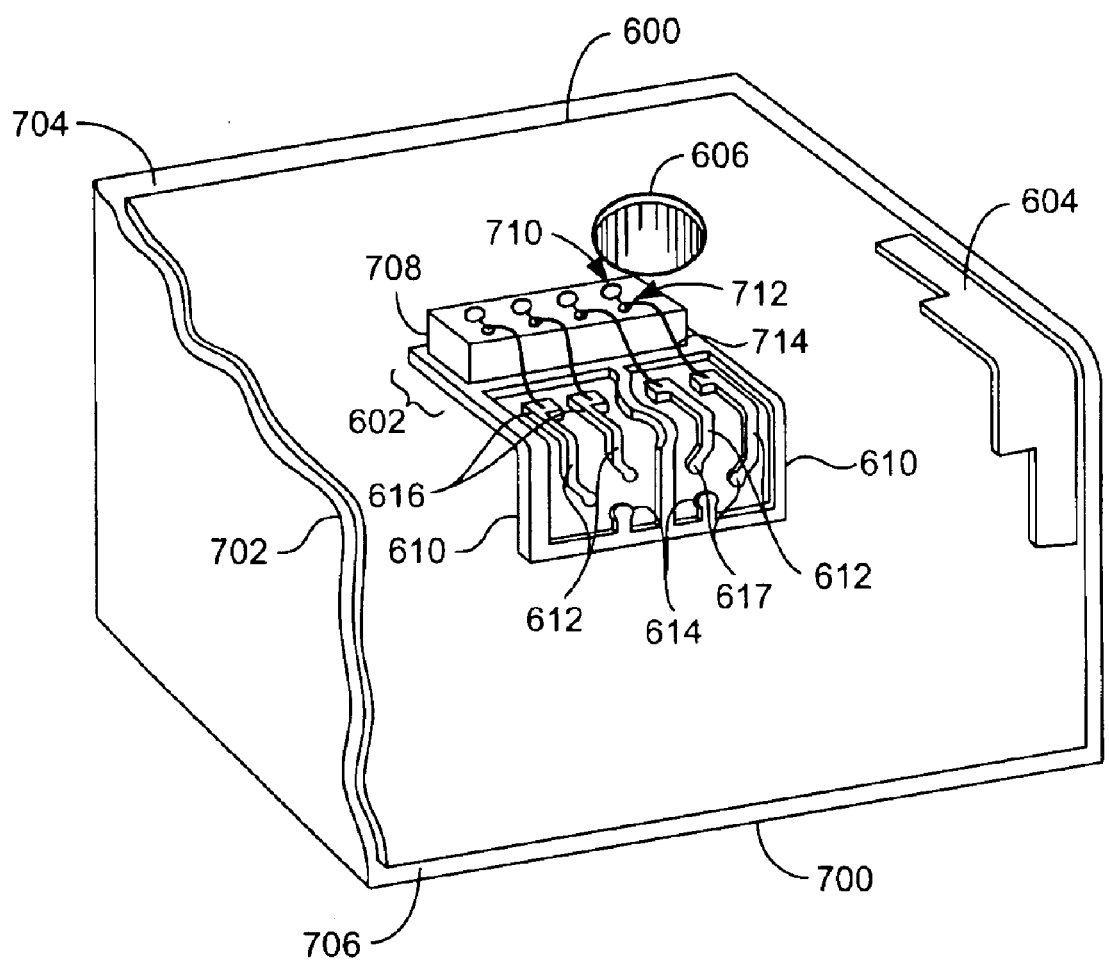
FIG. 7 illustrates a cut-away, perspective view of the flexi tape of FIG. 6 attached to a backing block.

FIG. 7 illustrates a cut-away, perspective view of flexi tape 600 attached to a backing block 700. Flexi tape 600 is bent around the corner 702 of the backing block 700 such that flexi tape 600 covers most of the front surface 704 and the bottom surface 706 of the backing block. The flexi 600 is bent such that the cathode traces 610 and the anode traces 612, and the stiffening pieces 604 bend around the corner 702 of the backing block. A photonic device array 708 is shown to be attached to the attach pad 608. The photonic device array 708 is a block of semiconductor material having optical circuitry formed within it. Commonly, the semiconductor material is Gallium-Arsenide. The bottom surface of the photonic device array 708 is the cathode, which is bonded to the attach pad 608. The backside or cathode of the array 708 is attached by one of several adhesives such as epoxy (e.g., Epotek H2OE, E3001, EG101-3, EMI Emcast 501, 550) or eutectic solder.

The photonic device array 708 has four active facets 710, which are either laser emitters or detectors. Each active facet 710 is connected to a respective anode bond pad 712, which is wire bonded to a respective bond pad 616 of the anode traces 612 with a respective wire 714. In some embodiments of the invention, the wire bonds between the anodes 712 and the bond pads 616 are reverse wire bonds such that the ball bond is formed on the bond pads 616 and the stitch bonds are formed on the anodes 712. In this way, the height of the wire loop above the photonic device array 708 is minimized. In this manner, the distance between the photonic device array 708 and the optical fibers to be connected can also be minimized. For instance, with the standard 25 um (1 mil wire) gold wire, the loop can be kept between 40 to 80 um (average of 60 um), allowing for a much closer fiber standoff distance than possible otherwise.

The active facets within the photonic device array 708 are all either laser emitters or optical detectors. In the case of lasers, these areas emit photons (formed as optical data). In the case of detectors, these areas receive photons and translate the signal to electrical data. Photonic device arrays containing different types of active facets are separated and attached to different circuitry sets 602 so that cross-talk between the two types of photonic device arrays is minimized. The photonic arrays are typically standard parts, but can also be custom-made, depending on a variety of requirements such as hermetic protection requirements.

The flexi circuit is attached to the backing block by a fluid adhesive or an adhesive tape. The fluid adhesive can be, for example, an epoxy-based adhesive. The viscosity of the fluid adhesive: 3,000 to 5,000 cP (centi Poise) at 25° C., as measured by a Brookfield viscometer running at 50 rpm. (Note: viscosity of water is 1 cP). This range of viscosity seems to work best for this application. When the viscosity is too high, glue application becomes inherently difficult to work with. On the other hand, when the viscosity is too low, the adhesive can flow uncontrollably into the holes of the backing block, ooze out of the sides of the flexi and onto the sides of the backing block, and even flow onto the active or front surface of the flexi where the traces are located. Therefore, it is critical to use an adhesive having an appropriate viscosity range. The adhesive should also be strong enough to withstand the pressure exerted by the wirebonding processes that will be used to attach wires to the photonic devices and the bond pads on the flexi. Exemplary adhesives that have proven to be effective are Epotek 353ND and QMI 506. Adhesive tapes that have proven to be effective are 3M 7303 and 583.

Figure 8:
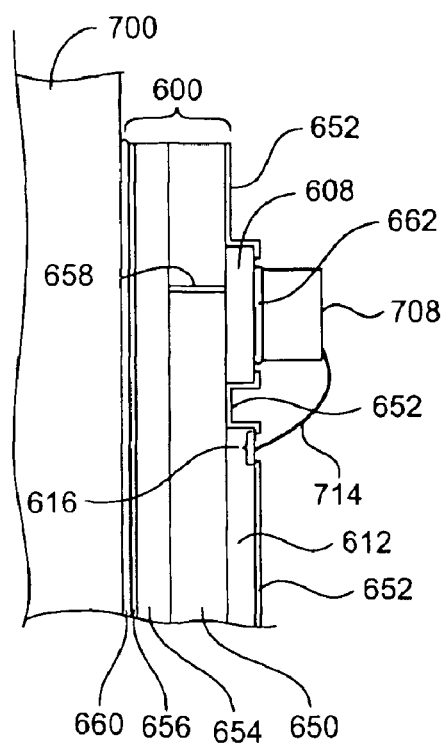
FIG. 8 illustrates a side plan, cut-away, cross-sectional view of the portion of the flexi that is attached to the front surface of a backing block.

FIG. 8 illustrates a side plan, cut-away, cross-sectional view of the portion of the flexi 600 that is attached to the front surface of the backing block 700. The cross-section is taken in a plane that cuts along an anode trace 612. In the cross-sectional view, the various layers that form the flexi 600 can be more clearly seen. The essential layers that form the flexi 600 are the flexible tape material layer 650 and the layer of metal circuitry containing the attachment pad and traces. Preferably, the flexi 600 also has a solder mask layer 652. Some embodiments of the flexi, including the embodiment of FIG. 8, an additional metal layer 654 and solder mask layer 656 is applied to the back surface of the flexi 600.

The foundational layer of the flexi 600 is the flexible tape material layer 650, which is typically formed of polyimide. The front or active side of the tape layer 650 is connected to the metal circuitry set 602. In this cross-sectional view, the portions of the circuitry set 602 that are visible are the attachment pad 608 and an anode trace 612. The section of the anode trace 612 nearest the attachment pad 608 represents the bond pad 616. A solder mask 652 covers the front surface of the flexi 600 while leaving openings to expose the bond pad 616 and the surface of the attachment pad 608. The additional metal layer 654 is added to the back surface of the flexi to provide an additional ground plane, to provide an alternative pathway for connection to the cathode, to provide more rigidity for the bending of the flexi, or to provide the flexi with additional support to withstand the force of wirebonding processes. The additional metal layer 654 can be connected to the metalization on the front surface of the flexi 600 through metal vias 658. The flexi 600 is attached to the backing block 700 with an adhesive layer 660.

A typical thickness range for each layer will now be provided. Note that the thickness for each layer may vary outside of the range provided here as the provided ranges are for exemplary purposes only. The thickness of the solder mask is typically between 25 and 40 micrometers (um). The metal layers have a thickness that is typically about 17.5 um. The latter thickness is typically known as 0.5 oz copper in the flexi or printed circuit board terminology, and refers to the weight of copper plated per unit area. The flexible tape material layer is typically between 25–50 um.

Photonic device array 708 is attached to the attachment pad 608 with a conductive epoxy layer 662. Interconnect wire 714 connects the anode on the front surface of the photonic device 708 to the bond pad 616.

Figure 9:
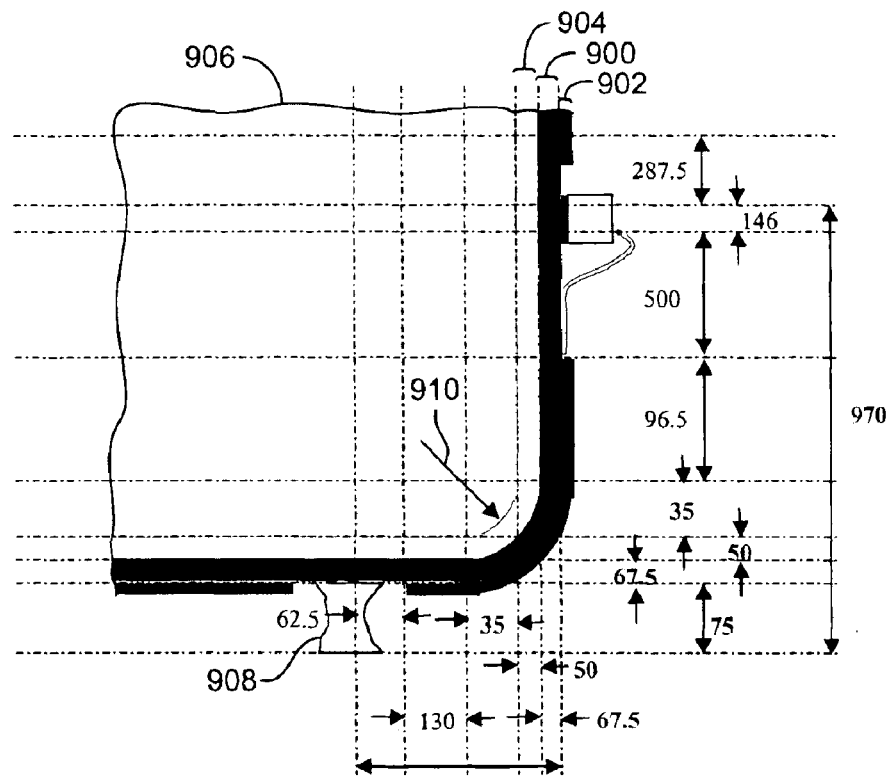
FIG. 9 illustrates a side plan, cross-sectional view of a flexi attached to a backing block wherein exemplary dimensions are shown.

FIG. 9 illustrates a side plan, cross-sectional view of a flexi 900 attached to the front and bottom surfaces of a backing block wherein exemplary dimensions are shown.

The dimensions are in micrometers ($10^{-6}$ meters). The flexi 900 represents both the flexible tape material layer and the layer of metalization. Layer 902 represents the solder mask layer, layer 904 represents an adhesive tape used to secure the flexi 900 to the backing block 906. Solder material 908 represents the solder connection that connects the traces of the flexi and an uplinking contact surface of a CSA. The radius 910 of the bottom-front corner can range from 25–500 um. Preferably the radius is approximately 50–100 um to eliminate bulging of the flexi and potential cracking of metal lines and solder mask at sharper bend corners. The vertical distance from the photonic device to the top surface of a driver module, such as a semiconductor chip assembly, is shown to be approximately 970 um. In alternative embodiments, this distance can range between 800–1600 um.

For any embodiment of the present invention, the OSA should be manufactured with very high tolerances to ensure proper alignment of the optical fibers to the photonic devices. For example, deformation due to thermal expansion should also be factored into the manufacturing process. It is noted that the distance between certain points of the OSA are especially important. First, the distance between the center of the alignment-pin holes to the center of each active facet on the photonic devices should be precise to ensure correct fiber alignment to the photonic device. Secondly, the distance between the center of the alignment-pin holes to the top surface of the connected CSA should be precise to ensure correct alignment between the optical fiber connector and the alignment pin.

Figure 10:
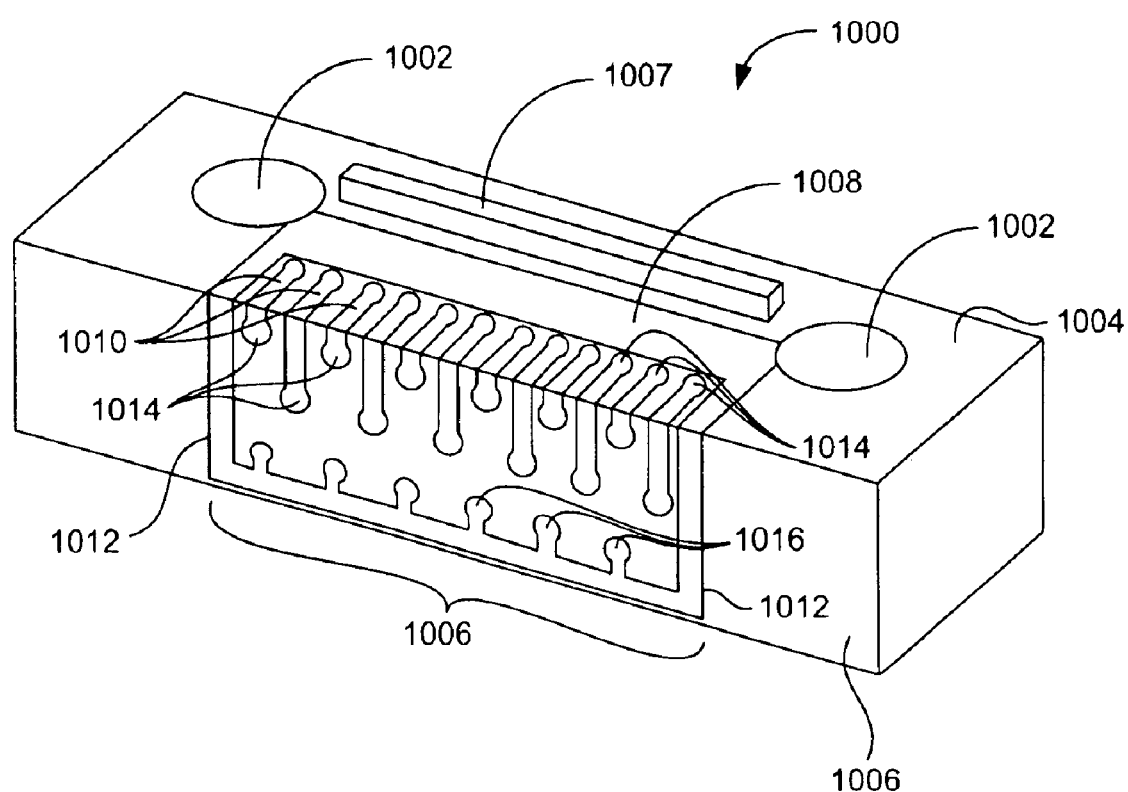
FIG. 10 illustrates a perspective view of an alternative embodiment of a backing block that is made of a ceramic material having embedded electric circuit traces.

FIG. 10 illustrates a perspective view of an alternative embodiment of a backing block 1000 that is made of a ceramic material (e.g., $Al_2O_3$) having embedded electric circuit traces. The ceramic backing block 1000 has alignment holes 1002 formed in the front surface 1004, and a circuitry set 1006 directly formed in both the front surface 1004 and the bottom surface 1006 of the backing block 1000. The circuitry set 1006, similar to the circuitry set shown in FIGS. 6 and 7, has an attachment pad 1008, a set of anode traces 1010, cathode traces 1012, bond pads 1014 on each end of the anode traces 1010, and bond pads 1016 formed on the cathode traces 1012. Shim 1007 is located above attachment pad 1008 and between alignment holes 1002. Shim 1007 can be integrally formed with the ceramic material of block 1000 or it can be a separate piece of material that is attached to block 1000.

The ceramic backing block 1000 has certain advantages and disadvantages over the combination of the backing block and flexi. For instance, advantages include the fact that the ceramic backing block is easier to handle and to attach to a CSA with the required accuracy, it has better thermal characteristics such as for purposes of heat dissipation, the circuit traces can be formed to be more precisely laid out within a single plane, and it is potentially possible to achieve a higher assembly yield. On the other hand, disadvantages include higher costs and looser tolerance capabilities that can adversely affect the fiber alignment to the photonics. To incorporate benefits of both material choices, a ceramic block could form the front end (attached to the PEEK block) for optimal electrical and mechanical interfacing. In this case, the ceramic block will have two alignment holes that are slightly larger than the alignment holes of the PEEK block. Much tighter tolerances can be achieved with injection molding of the PEEK block. As a result, the holes in the PEEK block are used to insert the two alignment pins. The holes in the ceramic block will be centered with respect to the alignment pins so that the ceramic block can be properly located and glued to the PEEK block.

The ceramic block can be made of high purity alumina (e.g., >95%). The high purity ensures that the surface of the molded and sintered ceramic is smooth and free of pores. A porous surface, or a surface pockmarked by microscopic voids, will affect the quality of the metallization steps. With ceramic processing, typically a thin adhesion layer is sputtered first to ensure good adhesion between metal and ceramic, followed by metal deposition based on the circuit layout described in the flexi embodiments. Unlike the embodiment using a flexible circuit bent around the block, the ceramic version does not need to have a radius. As a matter of fact, a radius would impact the metal deposition process. A sharp radius leads to much shorter trace lengths, which would reduce the electrical parasitics and improve electrical performance.

In an alternative embodiment of the present invention, a hinge can be formed on the backing block into which a pin on the ferrule can be inserted. This hinge configuration allows for the ferrule to swing about the backing block in a similar manner to a door in a doorframe. The purpose of this configuration is to allow the optical fiber(s) to be brought into and out of optical communication with the photonic device through this swinging action. Location of the hinge, which determines the axis about which the ferrule rotates, should be offset from the photonic device. For example, the hinge can be formed at a side or above the photonic device. The hinge can be formed so that the swinging ferrule can be removed when desired, or the swinging ferrule can be permanently attached to the hinge of the backing block.

The discussion of the invention will now proceed to the process for making the optical sub-assembly. To make the optical sub-assembly, certain materials, supplies and tools should be gathered. The basic materials and supplies needed are Flexible PCBs, backing blocks, alignment pins, epoxy, Nitto or 3M high temperature polyimide tapes, a mold release agent, 600 mesh sand papers, semi-cured silicone rubber, silicone rubber strips, and IPA (Isopropyl Alcohol). The basic tools, equipment and supplies needed are a toggle clamping rig, a bending jig, a pin insertion jig, an oven, trays, scissors, tweezers, razor blades, pliers, optical microscopes, finger cots, brushes, $Ar_2$ plasma clean equipment, and $O_2$ plasma clean equipment.

Figure 11:
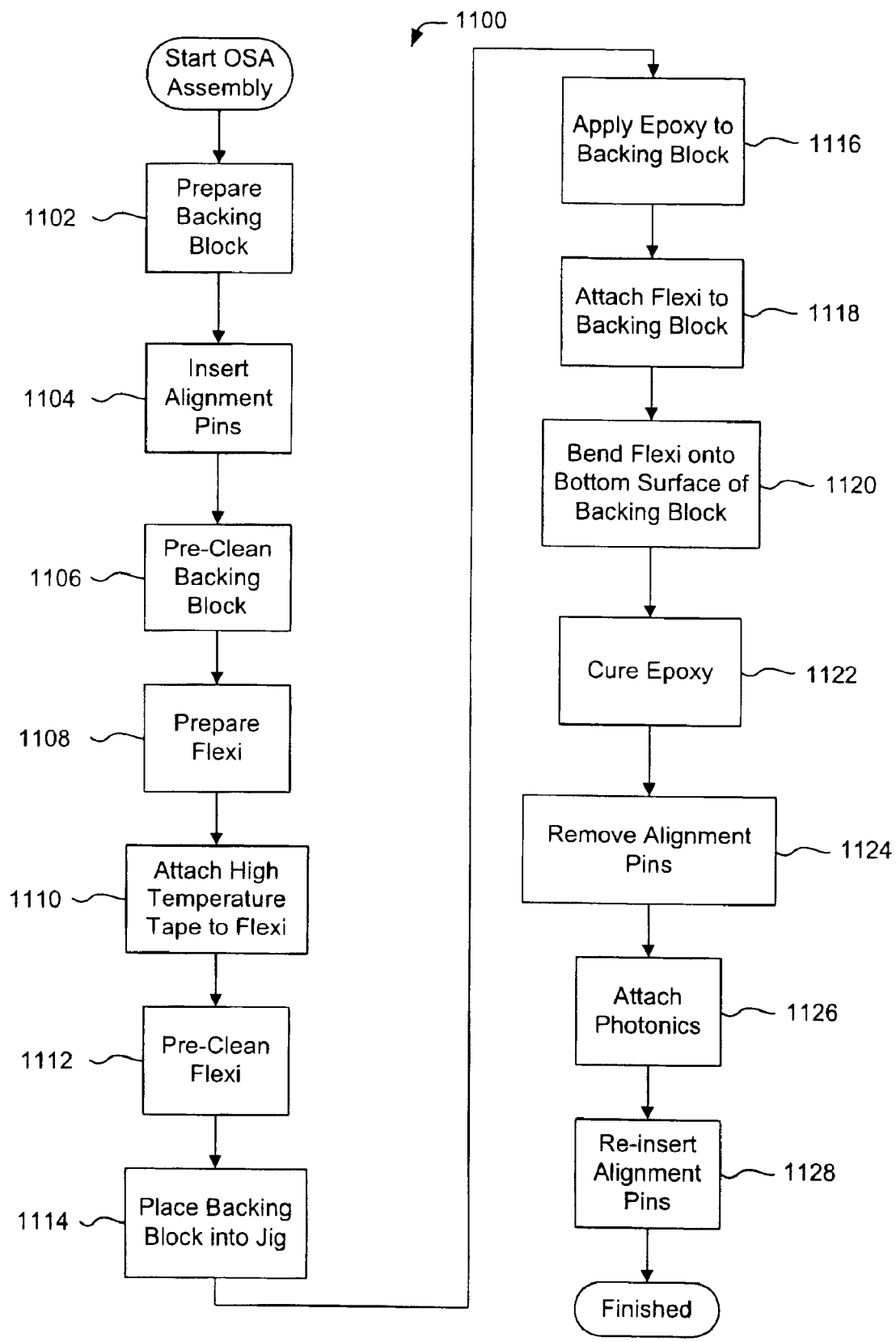
FIG. 11 is a flow diagram illustrating one embodiment of a process for assembling an optical sub-assembly.

FIG. 11 will now be described to help describe the process for making the OSA of the present invention. FIG. 11 is a flow diagram 1100 illustrating one embodiment of a process for assembling an optical sub-assembly. The process of FIG. 11 can be performed manually or by automated processes and the order of the individual operations may vary.

The process for making the backing block begins at operation 1102 with the preparation of the backing block. Preparation of the backing block involves forming the backing block, rounding the bottom-front corner of the backing block, and creating the alignment holes. As mentioned above, the backing block can be formed through a molding process. Also, the alignment holes should be bored into the backing block with a high degree of precision to ensure proper alignment between the photonic devices and the optical fiber connector. The alignment holes pass completely through the backing block. However, the backing block can be formed with alignment holes that pass only partially through the backing block. With respect to rounding the corner of the backing block, one method of creating the rounded corner is by sanding the corner if the block corner can not be molded to the correct dimensions. Sanding can be performed by holding the backing block with the edge to sand facing down to the polishing paper and then polishing for 30 seconds or so. The orientation of the backing block should be changed during polishing so to form a uniform radius and not a flat cut surface. In order to obtain the desired radius of the rounded corner, the backing block should be intermittently inspected. For example, after polishing for 30 seconds or so, the radius can be measured with a microscope. The goal is to form approximately a 50–100 µm radius at the bottom-front corner of the backing block. Continue to polish and measure the rounded corner as required.

In operation 1104, the alignment pins are inserted into the alignment holes of the backing block. The alignment pins are inserted from the backside so that they extend out from the front side of the block. The holes on backside do not have chamfers built in. A pin is inserted by holding the pin using flat pliers with the pin tip facing to one of two holes. Insert the pin tip to the hole gently and push down a little further with the pliers. Repeat this to insert the second pin. Position the backing block into a pin insertion jig with the front side of the backing block facing down. Make sure that both pins are positioned inside of the jig. Wind down the screw to further insert the pins until the pin length is left to be approximately 2 mm from backside of the block. This should result in approximately a 2.5 mm protrusion of the pin from the front side of the block. Rewind the screw to release the backing block and remove it from the jig.

In operation 1106, the backing block is pre-cleaned so that the residue from the preceding operations is removed. This is required for the proper attachment of the flexi to the backing block. The backing block can be cleaned with an oxygen plasma cleaning process. During plasma cleaning, backing blocks need to be positioned in such way that surfaces to be cleaned are exposed. The amount of time needed for plasma cleaning is approximately 15 minutes. Cleaned parts can be stored in nitrogen box. It is desirable that assembly is carried out within two (2) hours after parts are cleaned. Plasma re-clean is required if the cleaned parts sit for more than four (4) hours before assembly.

In operation 1108, flexible printed circuit material that will be used as the flexi is prepared. Typically, flexi is supplied in sheets and therefore should be separated. The sheets of flexi can be cut with scissors by using the printed patterns as a reference to separate the sheet into individual pieces of flexi. The sheets should be cut carefully to ensure that traces and patterns on flexi are not damaged. The size of the flexi pieces is determined by comparing the flexi and backing block. It is desired that the flexi is cut to be slightly smaller than front and bottom surfaces of the backing block.

In operation 1110, a high temperature tape is attached to the flexi. Effective high temperature tapes include Nitto and 3M High Temperature Tapes. The high temperature tape is attached to the front side of flexi to protect patterned areas during assembly processes. The high temp tape is cut so that the width of the tape is roughly same as the distance between the edges of two holes on flexi and the length of the tape is slightly longer than the length of flexi. Fold a small portion of the tape in a length-wise direction at one end. This folded portion will be used as a starting point to remove the tape from flexi after curing. Place the tape onto the front surface of flexi. It is very important to cover all the bonding pads, traces, and solder pads without covering any portion of the alignment holes. Press the tape gently using the flat end of tweezers to ensure a smooth and uniform attachment.

In operation 1112, the flexi pre-cleaned in preparation to be attached to the backing block. The flexi can be cleaned with an argon plasma cleaning process. During plasma cleaning, the flexi needs to be positioned in such way that the surface to be cleaned is facing up. The time needed for plasma clean is approximately 15 minutes. Cleaned parts can be stored in nitrogen box. It is desirable that assembly is carried out within two (2) hours after parts are cleaned. Plasma re-clean is required if the cleaned parts sit for more than four (4) hours before assembly.

In operation 1114, the backing block is placed into a toggle-clamping rig to secure the backing block during the processes for attaching the flexi to the backing block. Spray mold release onto recess area of toggle clamping rig in which backing block will be placed. This step needs to be done under good ventilation. Wait a couple of minutes to dry out the excessive mold release. Place the backing block into the recess area of toggle clamping rig using tweezers with assembly pin tips facing up. Insert back end of assembly pins into the holes on recess area of the toggle rig to ensure a secured positioning and alignment.

In operation 1116, epoxy glue is dispensed onto the front and bottom surfaces of the backing block. Dispense 2–3 lines of epoxy from syringe on backside of flexi using epoxy dispenser. Spread the epoxy to form an even and thin layer on backside of flexi using a painting brush. Collect a few drops of epoxy on a clean paper. Brush spread the drops to form an even and thin layer of epoxy on bonding surfaces of backing block. It is important not to apply an excessive amount of epoxy on either the flexi or the backing block. As was discussed before, the flexi can also be attached to the backing block with adhesive tape.

In operation 1118, the flexi is attached to the front surface of the backing block. Carefully align the backside of flexi onto the front side of backing block with the holes of the flexi aligned with the assembly pins on the backing block. Then place the flexi onto the front surface with the holes of the flexi placed over the pins.

To protect the holes in the flexi during assembly, certain steps can be taken. One method involves shaping two silicone rubber balls with diameters of approximately 0.5 mm. Flatten the balls into discs in diameter of approximately 1 mm. Press rubber discs onto the tips of the pins so that they form a ring around the tip of the pin to protect the flexi holes during assembly. Position the white silicone rubber strip over the tips of the pins. Apply the toggle clamp while holding the rubber strip.

In operation 1120, the flexi is bent so that it becomes attached to the bottom surface of the backing block. Operation 1120 involves the following sub-operations. Position the toggle clamping rig inside of a bending jig. Adjust the precision screw on bending jig so that a minimum gap is left between clamping pieces of toggle rig and bending jig. Slowly wind down the screw in the vertical direction on bending jig to bend the flexi against backing block. Adjust the precision screw accordingly during bending so that the white rubber strip is crushed and is left with a thickness of approximately 0.5 mm. Special attention needs to be paid during bending to ensure a smooth and well-connected bending radius. Bending the flexi too loosely will result in voids and bulges of the epoxy glue at the bottom-front corner of the backing block. On the other hand, bending the flexi too tightly will damage the conductive traces in flexi at the corner of the backing block.

In operation 1122, the epoxy adhering the flexi to the backing block is cured. The oven for the curing process is pre-heated to 165° C. The bending jig assembly is placed into the oven and connected to a thermocouple that is, in turn, connected to a display. Wait for the oven to reach temperature of 150° C. Cure for approximately 10 minutes at 150° C. Remove jig from the oven. Loosen the precision screw on the bending jig and remove the toggle clamping rig from the bending jig. Wait for the toggle rig to cool down.

Remove the assembled OSA from toggle rig. Unclamp the toggle clamp. Remove silicone rubber strip gently from pin top. Insert a flat screwdriver, blade, or a similar tool into the recess area of the toggle rig and remove the backing block gently. Remove the silicone rubber discs from around the pin tips using tweezers or a needle under a microscope. Remove high temperature tape from front surface of flexi slowly and gently using tweezers under a microscope. Carefully clean residual silicone rubber on flexi surface under microscope. Pay attention not to damage the flexi circuitry.

In operation 1124, the assembly pins are removed from the OSA so that the photonic devices can be attached to the flexi. Remove the alignment pins from the backside of the backing block to avoid delamination of epoxy glue. Rotate the pins in place before removal to break any glue holding pins to holes to avoid delamination upon removal of pins. Pull out the pins from the backside of backing block. If pins are fit too tightly in the holes and can not be removed simply by using pliers, position the backing block into pin insertion jig with the pin tips facing upwards to screw. Wind down the screw to push pins back as far as possible without touching the flexi. Then remove the OSA from the pin insertion jig.

At this point the partially assembled OSA is inspected. The inspection process of the OSA assembly includes inspection of areas such as the alignment holes, the radius of the bottom-front corner, the flexi circuitry area, and the bond between the flexi and the backing block. During inspection of the alignment holes, gently and carefully remove any residual silicone rubber from the alignment hole area using tweezers or needles so not to damage any circuit traces. During inspection of the backing block, remove epoxy that wicked out during curing by sanding the surface gently on mesh sanding paper. Clean the parts after sanding using IPA. During inspection of the adhesion between the flexi and the backing block, make sure that a thin and smooth bonding line is achieved along the edges and that no bulges of epoxy glue are near the bending radius. During inspection of the bending radius, check to see if the copper circuitry traces cracked during bending of the flexi around the front-bottom corner of the backing block.

In operation 1126, photonic devices are picked and placed onto the flexi. The anodes of the photonic device are wire bonded to the bond pads of the anode traces.

In operation, 1128, the alignment pins are re-inserted into the backing block. At this point the assembled OSA can be attached to a CSA. For details regarding the process of attaching the OSA to the CSA, refer to U.S. patent application Ser. No. 09/947,210 entitled "TECHNIQUES FOR JOINING AN OPTOELECTRONIC MODULE TO A SEMICONDUCTOR PACKAGE".

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An optoelectronic package enabling optical communication with an optical fiber, the package comprising:
   a rigid base substrate having a first face and a second face that are angled relative to one another and electrical traces that extend from the first face to the second face, the base substrate being suitable for supporting photonic device on the second face of the base substrate and being suitable for aligning the photonic device with an external optical fiber when the optical fiber is mechanically engaged with the package at the second face of the block;
   a semiconductor chip assembly mounted on the first face of the base substrate, the semiconductor chip assembly having a plurality of first contacts that are electrically coupled to associated traces on the base substrate; and
   a photonic device mounted on the second face of the base substrate, the photonic device having at least one active facet thereon and having a plurality of second contacts that are electrically coupled to associated traces on the base substrate.

2. An optoelectronic package as recited in claim 1 wherein the first face and the second face of the base substrate are angled at approximately 90 degrees relative to one another.

3. An optoelectronic package as recited in claim 1 wherein the base substrate is formed from a ceramic material having the electrical traces formed thereon.

4. An optoelectronic package as recited in claim 1 wherein the base substrate includes a backing block and a flexible printed circuit interface having the electrical traces formed thereon, the flexible printed circuit interface being adhered to the backing block.

5. An optoelectronic package as recited in claim 4 wherein the first face and the second face of the base substrate are substantially perpendicular to one another, the optoelectronic package further comprising a smoothly rounded corner between the first face and the second face.

6. An optoelectronic package as recited in claim 5 wherein the radius of the rounded corner between the first and second faces is between approximately 50 and 100 microns.

7. An optoelectronic package as recited in claim 1 wherein the photonic device has a cathode and at least one anode, wherein the cathode is soldered directly to a cathode pad on the base substrate.

8. An optoelectronic package as recited in claim 7 wherein the anode(s) are wire bonded to associated traces on the base substrate.

9. An optoelectronic package as recited in claim 1 wherein the photonic device has bond pads thereon and at least some of the bond pads are reverse wire bonded to associated traces on the base substrate.

10. An optoelectronic package as recited in claim 1 further comprising an optical fiber in optical communication with the facet on the photonic device.

11. An optoelectronic package as recited in claim 10 further comprising:
    a fiber termination device that carries an end of the optical fiber; and
    at least one alignment pin that extends from the second face of the base substrate, wherein the alignment pin is arranged to engage the fiber termination device to position the optical fiber relative to the photonic device.

12. An optoelectronic package as recited in claim 10 wherein a distal tip of the optical fiber is oriented at a small angle relative to the second face of the base substrate.

13. An optoelectronic package as recited in claim 11 further comprising a shim that extends from the second face of the base substrate wherein the shim is in contact with the fiber termination device and maintains a standoff distance between the optical fiber and the photonic device.

14. An optoelectronic package as recited in claim 1 wherein the electrical path between a selected first contact and a selected second contact that serves as an anode for the photonic device is less than approximately 2 mm.

15. An optoelectronic package as recited in claim 1 wherein the photonic device includes a vertical cavity surface emitting laser or laser array.

16. An optoelectronic package as recited in claim 1 wherein the active facet is a detector or a detector array.

17. An optoelectronic package as recited in claim 1 wherein the semiconductor chip assembly is soldered directly to the base substrate to electrically connect the semiconductor chip assembly to the base substrate.

18. An optoelectronic package as recited in claim 1 wherein the semiconductor chip assembly is or includes a die having contacts on opposing top and bottom surfaces, wherein contacts on the top surface are coupled to the base substrate and contacts on the bottom surface are coupled to external devices.

19. An optoelectronic package as recited in claim 1 further comprising a smoothly rounded corner between the first face and the second face.

20. An optoelectronic package as recited in claim 18 wherein the radius of the rounded corner between the first and second faces is between approximately 50 and 100 microns.

21. An optoelectronic package as recited in claim 1 further comprising a shim that is attached to second face of the base substrate at a position proximate to the photonic device.

22. An optoelectronic package comprising:
   a rigid base having a front face and a bottom face being substantially perpendicular to one another, there being a smoothly rounded corner between the front face and the bottom face;
   a flexible substrate adhered to the front and bottom faces, the flexible substrate having electrical traces formed thereon;
   a driver module mounted on the flexible substrate under the bottom face, the driver module having a plurality of first contacts that are electrically coupled to associated traces on the flexible substrate;
   a photonic device mounted on the flexible substrate at the front face, the photonic device having at least one active facet thereon and having a plurality of second contacts that are electrically coupled to associated traces on the flexible substrate; and
   an optical fiber in optical communication with the facet on the photonic device.

23. An optoelectronic package as recited in claim 22 wherein the distance between the driver module and the photonic device is less than approximately 1000 microns.

24. An optoelectronic package as recited in claim 22 wherein the driver module has third contacts opposite the first contacts and wherein the first contacts are soldered directly to the base substrate and the third contacts are positioned for electrical connected to an external device.

25. An optoelectronic package as recited in claim 22 further comprising a shim that is attached to the flexible substrate at a position proximate to the photonic device.

26. An optoelectronic package comprising:
   a rigid mounting block having a first face and a second face and electrical traces that extend from the first face to the second face, the first and second faces being substantially perpendicular to one another;
   a semiconductor chip assembly mounted on the first face of the rigid mounting block, the semiconductor chip assembly having a first surface having a plurality of first contacts that are electrically coupled to associated traces on the rigid mounting block by direct soldering and a second surface opposite the first surface, the second surface of the semiconductor chip assembly having plurality of second contacts that are suitable for electrical connection to external devices;
   a photonic device mounted on the second face of the rigid mounting block, the photonic device having at least one active facet thereon and having a cathode and at least one anode, wherein the cathode is directly soldered to an associated cathode trace on the base substrate; and
   an optical fiber in optical communication with the facet on the photonic device.

27. An optoelectronic package as recited in claim 26 wherein the rigid mounting block is one selected from the group consisting of:
   a rigid mounting base unit formed from a ceramic material having the electrical traces formed thereon; and
   a structure includes a rigid backing block and a flexible printed circuit interface adhered to the backing block, the flexible printed circuit interface having the electrical traces formed thereon.

28. An optoelectronic package as recited in claim 26 further comprising:
   a fiber termination that carries an end of the optical fiber; and
   a pair of alignment pins that extend from the second face of the base substrate, wherein the alignment pins are arranged to engage the fiber termination to position the optical fiber relative to the photonic device.

29. An optoelectronic package as recited in claim 26 wherein the electrical path between a selected first contact and a selected second contact that serves as an anode for the photonic device is less than approximately 2 mm.

30. An optoelectronic package as recited in claim 26 wherein the photonic device includes a vertical cavity surface emitting laser or laser array.

31. An optoelectronic package as recited in claim 1 wherein the base substrate is constructed using a material selected from among polyethylene ether ketone (PEEK), liquid crystal polymer (LCP), polyphenylene sulfide (PPS), and ceramic materials.

32. An optoelectronic package as recited in claim 26 wherein the active facet of the photonic device mounted on the second face of the rigid mounting block is arranged to project a light beam away from the mounting block into the optical fiber.

* * * * *